(12) United States Patent
Dakshinamurthy et al.

(10) Patent No.: US 9,225,302 B2
(45) Date of Patent: Dec. 29, 2015

(54) CONTROLLED POWER BOOST FOR ENVELOPE TRACKER

(71) Applicant: Broadcom Corporation, Irvine, CA (US)

(72) Inventors: Sriraman Dakshinamurthy, San Jose, CA (US); Robert Gustav Lorenz, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 65 days.

(21) Appl. No.: 13/919,465

(22) Filed: Jun. 17, 2013

(65) Prior Publication Data

US 2014/0285261 A1 Sep. 25, 2014

Related U.S. Application Data

(60) Provisional application No. 61/804,003, filed on Mar. 21, 2013, provisional application No. 61/732,780, filed on Dec. 3, 2012.

(51) Int. Cl.
| | |
|---|---|
| *H03G 3/20* | (2006.01) |
| *H03F 3/20* | (2006.01) |
| *H03F 1/02* | (2006.01) |
| *H03F 1/32* | (2006.01) |
| *H03F 3/195* | (2006.01) |
| *H03F 3/24* | (2006.01) |

(52) U.S. Cl.
CPC .................. *H03F 3/20* (2013.01); *H03F 1/025* (2013.01); *H03F 1/3241* (2013.01); *H03F 3/195* (2013.01); *H03F 3/245* (2013.01); *H03F 2200/336* (2013.01); *H03F 2200/435* (2013.01)

(58) Field of Classification Search
CPC .............................. H03F 1/02; H03F 2200/102
USPC .................. 330/127, 136, 297; 375/296, 297; 455/114.3
See application file for complete search history.

(56) References Cited

U.S. PATENT DOCUMENTS

| | | | |
|---|---|---|---|
| 6,674,856 B1 | 1/2004 | Hendricks et al. | |
| 7,482,869 B2 | 1/2009 | Wilson | |
| 7,764,060 B2 | 7/2010 | Wilson | |
| 7,868,698 B2 | 1/2011 | Wilson | |
| 8,093,945 B2 | 1/2012 | Wimpenny | |
| 8,093,946 B2 | 1/2012 | Wimpenny et al. | |
| 8,093,979 B2 | 1/2012 | Wilson | |
| 8,106,713 B2 | 1/2012 | Wilson | |
| 8,169,261 B2 | 5/2012 | Wilson | |

(Continued)

OTHER PUBLICATIONS

Behravan, Ali, et al., Adaptive Predistorter Design for Nonlinear High Power Amplifiers, Chalmers University of Technology, Göteborg, Sweden, 2003, 4 pages.

(Continued)

*Primary Examiner* — Khanh V Nguyen
*Assistant Examiner* — Khiem Nguyen
(74) *Attorney, Agent, or Firm* — Brinks Gilson & Lione (57) ABSTRACT

An envelope-tracking (ET) power supply may include a boost control pin. The boost control pin receives a boost enable signal that activates or enables a supplemental power supply in the ET power supply. The supplemental power supply facilitates the generation of a power supply signal for a selected processing stage, e.g., a power amplifier. The supplemental power supply helps the processing stage meet the demands on it caused by the signal that the processing stage needs to handle.

20 Claims, 5 Drawing Sheets

(56) References Cited

U.S. PATENT DOCUMENTS

| | | | |
|---|---|---|---|
| 8,294,522 | B2 | 10/2012 | Flint et al. |
| 8,319,570 | B2 | 11/2012 | Wilson |
| 8,570,105 | B2 * | 10/2013 | Wimpenny et al. ........... 330/136 |
| 2004/0061555 | A1 * | 4/2004 | Lynch ........................... 330/136 |
| 2012/0269240 | A1 * | 10/2012 | Balteanu et al. ............. 375/219 |
| 2012/0270511 | A1 | 10/2012 | Dakshinamurthy et al. |
| 2012/0326783 | A1 * | 12/2012 | Mathe et al. .................. 330/251 |

OTHER PUBLICATIONS

Dahlman, Erik, et al., Key features of the LTE radio interface, Ericsson Review No. 2, 2008, 4 pages.

Le Gallou, Nicolas, et al., Over 10MHz Bandwidth Envelope-Tracking DC/DC converter for Flexible High Power GaN Amplifiers, 2011 IEEE MTT-S International Microwave Symposium, Baltimore, Maryland, 2011, 4 pages.

LTM 9003, 12-Bit Digital Pre-Distortion μModule Receiver Subsystem, Linear Technology Corporation, Milpitas, California, downloaded May 2013, 24 pages.

Schow, C.L., et al., Transmitter Pre-Distortion for Simultaneous Improvements in Bit-Rate, Sensitivity, Jitter, and Power Efficiency in 20 Gb/s CMOS-driven VCSEL Links, Optical Society of America, 2011, 3 pages.

Basic PA Linearization Concepts: Predistortion Techniques vs. Operation in Backoff, Scintera Networks, Inc., 2009-2011, 3 pages.

Seydou, N., Efficient Digital Baseband Predistortion for Modern Wireless Handsets, Georgia Institute of Technology, Dec. 2009, 133 pages.

GC5322, Wideband Digital Pre-Distortion Transmit IC Solution, Texas Instruments Incorporated, 2008, 4 pages.

GC5325, Wideband Digital Predistortion Transmit Processor, Texas Instruments Incorporated, 2009, 24 pages.

GC5328, Low-Power Wideband Digital Predistortion Transmit Processor, Texas Instruments Incorporated, 2009, 27 pages.

Verfaillie, G., White paper Equalising and Predistortion: The Equalink™ concept, Newtec Cy N.V., 2008, 8 pages.

* cited by examiner

CONTROLLED POWER BOOST FOR ENVELOPE TRACKER

CROSS REFERENCE TO RELATED APPLICATIONS

This application claims the benefit of priority to U.S. Provisional Application No. 61/804,003, filed Mar. 21, 2013, and to U.S. Provisional Application No. 61/732,780, filed Dec. 3, 2012, both of which are incorporated herein by this reference.

TECHNICAL FIELD

This disclosure relates to signal transmission. In particular, this disclosure relates to improvements in the transmit chain, including in an envelope tracker, and in other aspects of a wireless communication device.

BACKGROUND

Rapid advances in electronics and communication technologies, driven by immense customer demand, have resulted in the widespread adoption of mobile communication devices. The extent of the proliferation of such devices is readily apparent in view of some estimates that put the number of wireless subscriber connections in use around the world at nearly 80% of the world's population. Furthermore, other estimates indicate that (as just three examples) the United States, Italy, and the UK have more mobile phones in use in each country than there are people living in those countries. Improvements in wireless communication devices will help continue to make such devices attractive options for the consumer.

BRIEF DESCRIPTION OF THE DRAWINGS

The innovation may be better understood with reference to the following drawings and description. In the figures, like reference numerals designate corresponding parts throughout the different views.

DETAILED DESCRIPTION

The discussion below makes reference to user equipment, and particularly with reference to an envelope tracker that supplies a power amplifier voltage supply signal to a power amplifier in a transmit chain. User equipment may take many different forms and have many different functions. As one example, user equipment may be a cellular phone capable of making and receiving wireless phone calls. The user equipment may also be a smartphone that, in addition to making and receiving phone calls, runs general-purpose applications. User equipment may be virtually any device that wirelessly connects to a network, including as additional examples a driver assistance module in a vehicle, an emergency transponder, a pager, a satellite television receiver, a networked stereo receiver, a computer system, music player, or virtually any other device.

Figure 1:
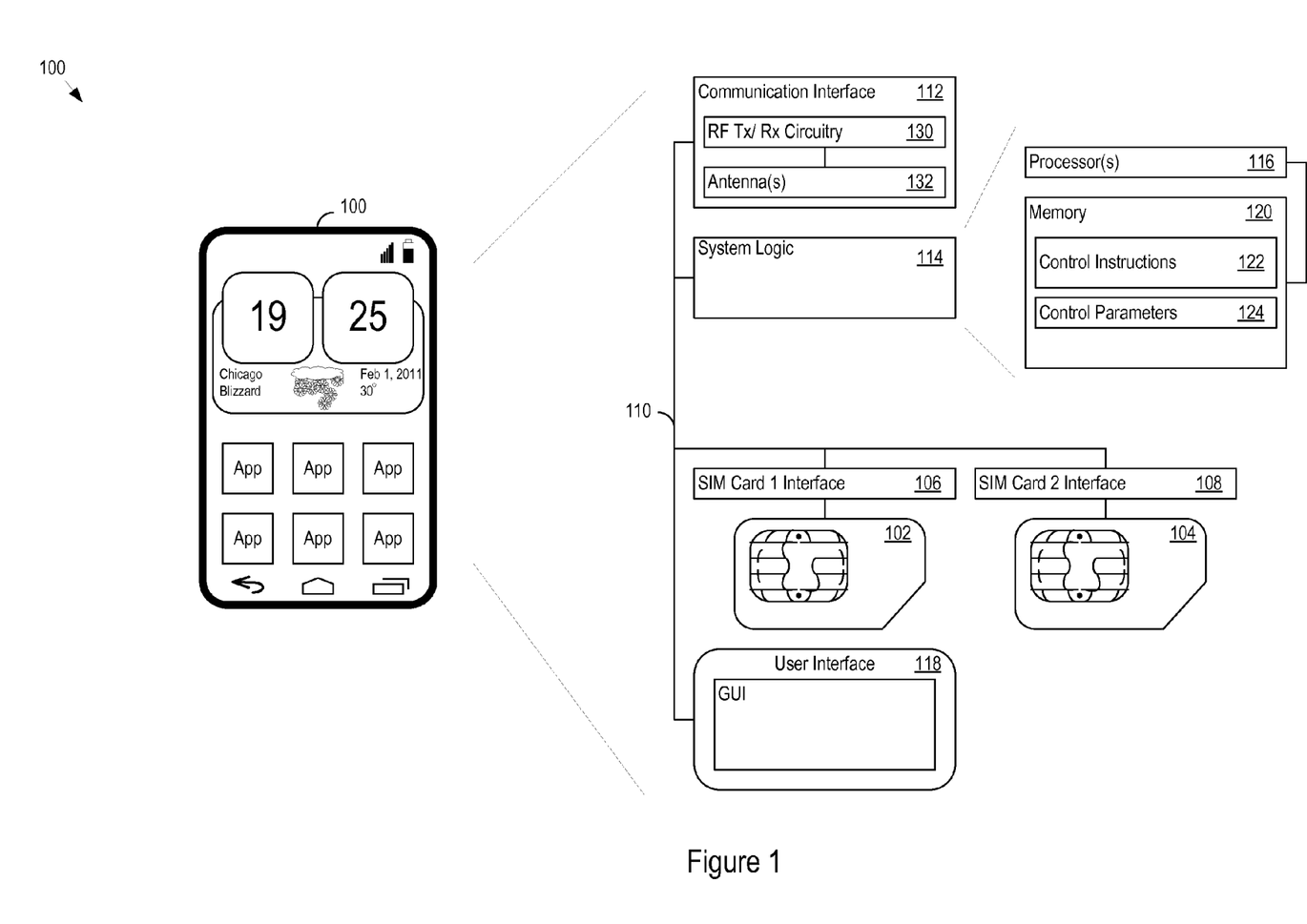
FIG. 1 shows an example of user equipment that includes a transmit chain and a receive chain.

FIG. 1 shows an example of user equipment 100 with multiple SIMs (subscriber identity modules), in this example the SIM1 102 and the SIM2 104. An electrical and physical interface 106 connects SIM1 102 to the rest of the user equipment hardware, for example, through the system bus 110. Similarly, the electrical and physical interface 108 connects the SIM2 to the system bus 110.

The user equipment 100 includes a communication interface 112, system logic 114, and a user interface 118. The system logic 114 may include any combination of hardware, software, firmware, or other logic. The system logic 114 may be implemented, for example, in a system on a chip (SoC), application specific integrated circuit (ASIC), or other circuitry. The system logic 114 is part of the implementation of any desired functionality in the user equipment. In that regard, the system logic 114 may include logic that facilitates, as examples, running applications, accepting user inputs, saving and retrieving application data, establishing, maintaining, and terminating cellular phone calls, wireless network connections, Bluetooth connections, or other connections, and displaying relevant information on the user interface 118. The user interface 118 may include a graphical user interface, touch sensitive display, voice or facial recognition inputs, buttons, switches, and other user interface elements.

The communication interface 112 may include one or more transceivers. The transceivers may be wireless transceivers that include modulation/demodulation circuitry, digital to analog converters, analog to digital converters, filters, waveform shapers, amplifiers and/or other logic for transmitting and receiving through one or more antennas, or through a physical (e.g., wireline) medium. As one implementation example, the communication interface 112 and system logic 114 may include a BCM2091 EDGE/HSPA Multi-Mode, Multi-Band Cellular Transceiver and a BCM59056 advanced power management unit (PMU), controlled by a BCM28150 HSPA+system-on-a-chip (SoC) baseband smartphone processor or a BCM25331 Athena (TM) baseband processor. These integrated circuits, as well as other hardware and software implementation options for the user equipment 100, are available from Broadcom Corporation of Irvine, Calif.

The transmitted and received signals may adhere to any of a diverse array of formats, protocols, modulations (e.g., QPSK, 16-QAM, 64-QAM, or 256-QAM), frequency channels, bit rates, and encodings. As one specific example, the communication interface 112 may support transmission and reception under the Universal Mobile Telecommunications System (UMTS). The techniques described below, however, are applicable to other communications technologies that include paging whether arising from the 3rd Generation Partnership Project (3GPP), GSM (R) Association, 4G/Long Term Evolution (LTE) (TM) efforts, High Speed Packet Access (HSPA)+, or other partnerships or standards bodies.

In one implementation, the system logic 114 includes one or more processors 116 and a memory 120. The memory 120 stores, for example, control instructions 122 that the processor 116 executes to carry out any of the processing or control functionality described below with respect to the various technologies. The memory 120 may also include control parameters 124 that the control instructions read, write, or modify in carrying out the functionality.

In the communication interface 112 (or elsewhere in the user equipment 100), Radio Frequency (RF) transmit (Tx) and receive (Rx) circuitry 130 handles transmission and reception of signals through the antenna(s) 132.

Figure 2:
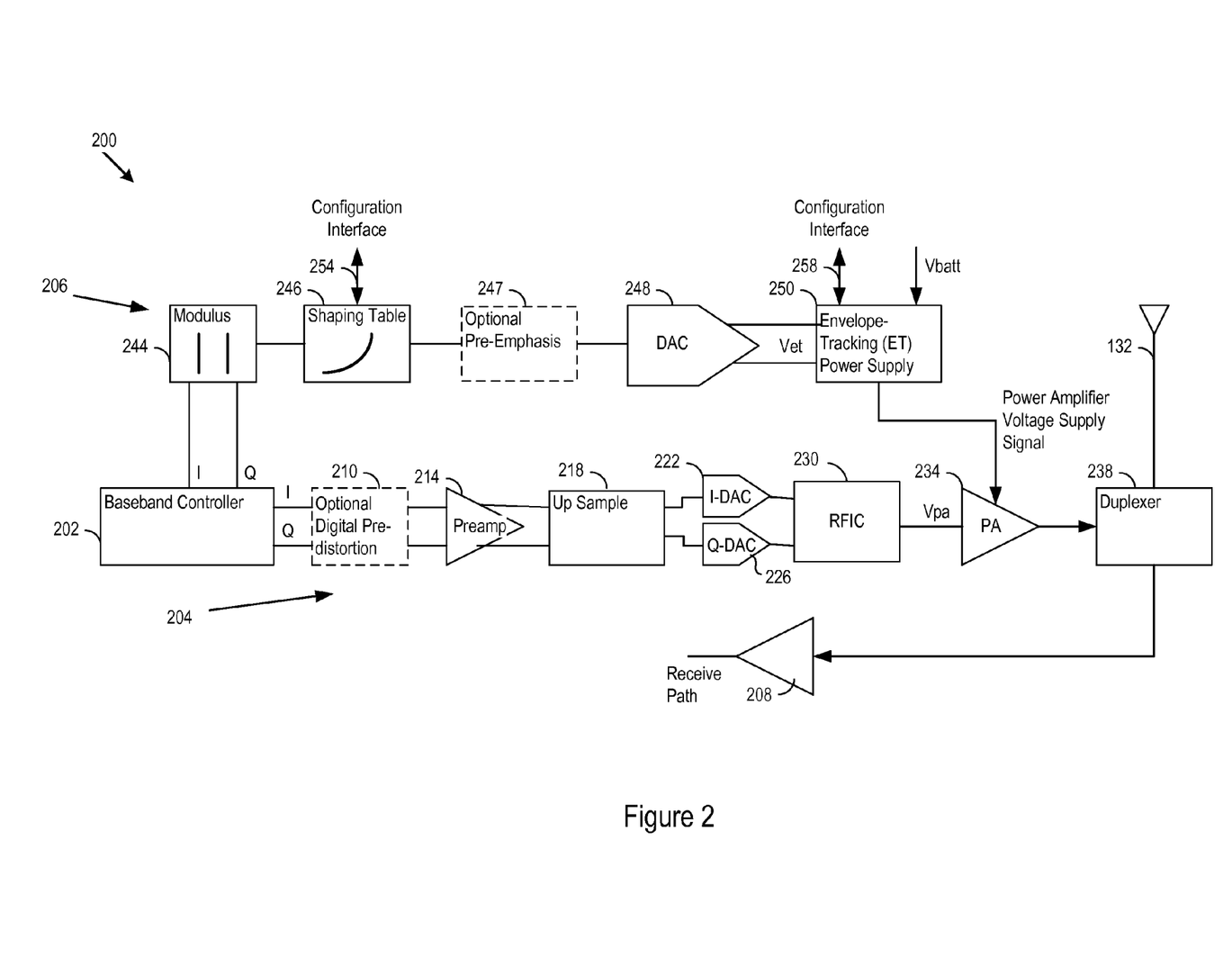
FIG. 2 is an example of a transmit and receive chain that includes a radio frequency (RF) signal path and an envelope-tracking (ET) path.

FIG. 2 shows an example of a transmit/receive chain 200 that may be present in the user equipment 100, e.g., distributed among the Tx/Rx circuitry 130 and system logic 114. The chain 200 includes a baseband controller 202, a radio frequency (RF) signal path 204, an envelope-tracking (ET) path 206 and a receive path (208). The baseband controller 202 may supply inphase/quadrature (I/Q) input signal samples to both the RF signal path 204 and the ET path 206.

The RF signal path 204 may optionally include pre-distortion logic 210. The RF signal path 204 may further include a preamplifier (PA) 214, an up sampler 218, an inphase digital-to-analog converter (I-DAC) 222, a quadrature digital-to-analog converter (Q-DAC) 226, a radio frequency integrated circuit (RFIC) 230, a power amplifier (PA) 234 and a duplexer 238.

The pre-distortion logic 210, if present, may modify the input signal samples from the baseband controller prior to generation of the preamplifier output signal to the up sampler 218. The up sampler 218 may generate additional signal samples to provide more signal information with which the I-DAC and the Q-DAC may convert to an analog signal. The RFIC 230 may then filter and process the analog signal to generate an acceptable RF signal to be amplified by the PA 234 for transmission. The bandwidth of the signal going into the PA (Vpa) may range between 100 MHz and 1.9 GHz, and thus vary widely. The duplexer 238 passes amplified transmit signals through an antenna 132, and passes received signals from the antenna 132 to the receive path 208.

The ET path 206 may include modulus logic 244, a shaping table 246, an optional pre-emphasis 247, a digital-analog-converter (DAC) 248 and an envelope-tracking (ET) power supply 250. The baseband controller 202 may further provide the I/Q input signal samples to the modulus logic 244. The modulus logic 244 may output the absolute value (e.g., the square root of I squared plus Q squared) of the input signal to the shaping table 216. The shaping table 246 maps input values to output values in a linear or non-linear manner. The output of the shaping table 216 feeds the pre-emphasis 247, if present, which may perform additional filtering and processing of the shaped signal. The output of the pre-emphasis feeds the DAC 248, which outputs an analog signal that has the envelope of the input signal, as modified by the shaping table 246 and the pre-emphasis 247.

The envelope-tracking (ET) power supply 250 receives the envelope reference signal from the DAC 248. The ET power supply 250 may output a power amplifier (PA) voltage supply signal that follows the envelope, plus a preconfigured amount of headroom. In other configurations, the ET power supply 250 may output a different supply signal, such as a DC supply signal that may be equal, e.g., to the battery voltage Vbatt, or another DC variant of Vbatt. The PA voltage supply signal provides power to the PA 206 for driving the antenna 132 with the transmit signal. When the ET power supply 250 tracks the envelope of the input signal to be amplified, however, a power savings may often be achieved compared to driving the power amplifier with a fixed DC voltage.

Configuration interfaces 254 and 258 may be provided to configure the shaping table 246 and the envelope-tracking power supply (ET) 250, respectively, or other parts of the user equipment 100. The interfaces 254 and 258 may be MIPI interfaces or some other type of serial and/or parallel interface.

Figure 3:
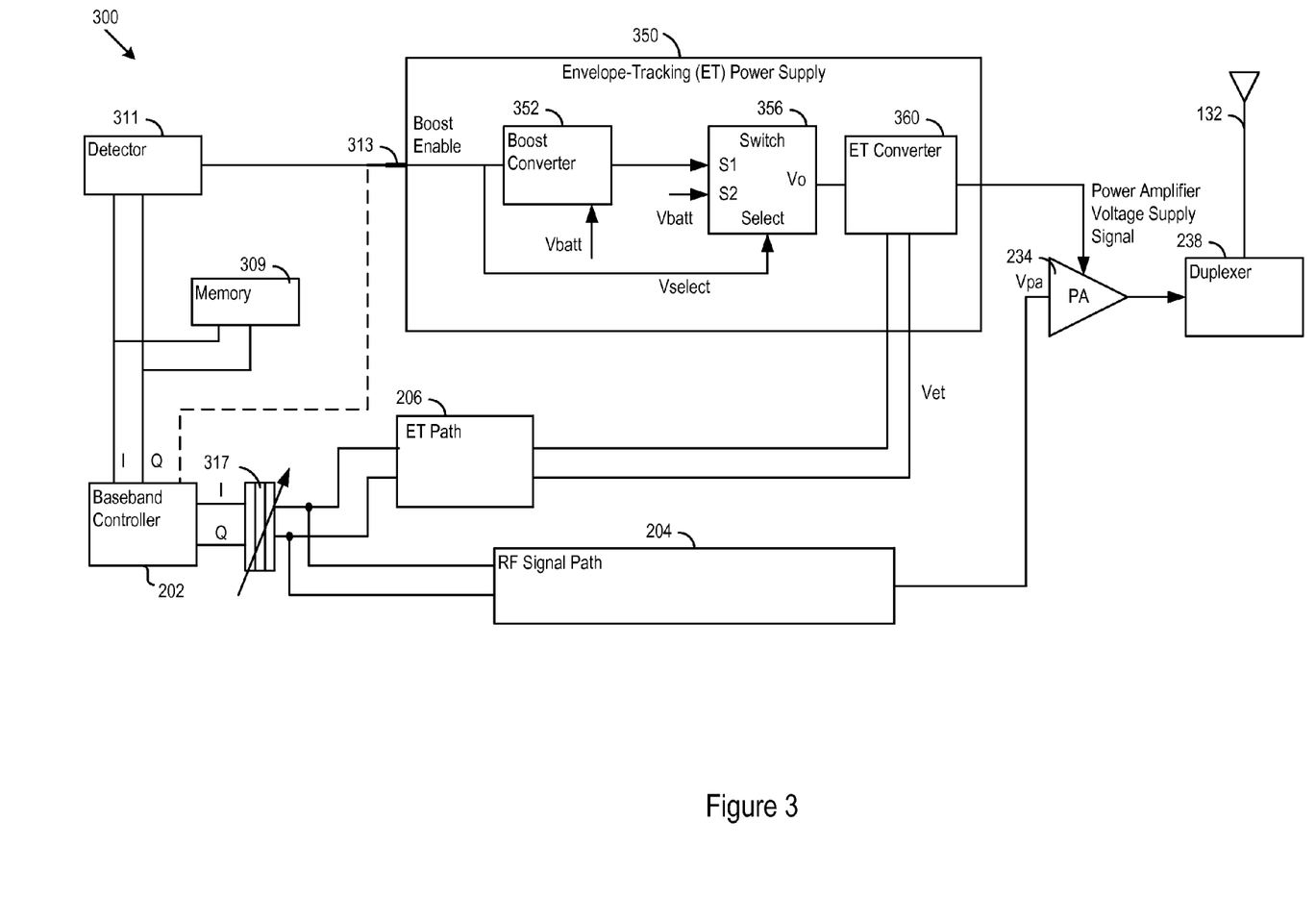
FIG. 3 is an example of an augmented transmit chain with a modified ET power supply.

FIG. 3 is an example of an augmented transmit chain 300 with a modified ET power supply 350. The ET power supply 350 may include a boost converter 352, a switch 356 and an ET converter 360. The transmit chain 300 may further include a signal sample memory 309, a digital detector 311 and a variable signal buffer 317.

The input signal (Vpa) to the PA 234 often contains short, but significant, signal peaks. These peaks may require additional power output from the power amplifier, which is supplied by the voltage supply signal from the ET power supply 350. It may be inefficient from a power standpoint to always have the boost converter 352 in the ET power supply 350 up and running to handle these peaks. To have the boost converter 352 active when it will benefit the ET power supply 350 and avoid consuming power when it is not needed, a dedicated boost pin 313 added to the ET power supply 350 may quickly enable and disable the boost converter 352.

The boost converter 352 may be enabled at any selected time, and in particular when the peaks are expected to be at the input (Vet) of the ET power supply 350, and thus at the input of the PA 234 as well. The baseband controller 220 and/or other circuitry may provide intelligent baseband analysis of the upcoming signal to determine when the peaks will arrive and responsively drive the boost control pin 313 with a boost signal. The other circuitry may include the signal sample memory 309 and/or the detector 311. The baseband controller and/or this other circuitry may generate a boost signal to enable/disable the boost converter 352. The boost signal may be generated in response to any signal characteristic that warrants supplemental power supplied to the ET converter 360.

More specifically, the ET power supply 350 may be capable of supporting an output voltage or current that is larger than the battery voltage or current using a boost converter 352. In one implementation, the boost mode of the ET power supply 350 helps to provide the power required to handle peaks of a OFDM (orthogonal frequency division multiplexing) or SC-FDMA (single carrier frequency division-multiplexing) waveform. Accordingly, significant power savings may be achieved during operation of the ET power supply 350 by enabling the boost converter 352 with the boost control pin 313 for signal peaks, and otherwise keeping the boost converter 352 disabled.

As discussed, the baseband controller 220 may provide intelligent baseband analysis of the upcoming signal to determine when the peaks will arrive and responsively drive the boost control pin 313 with a boost signal, thus enabling the boost converter 352. Accordingly, the detector 311 may be implemented as software in the baseband controller looking at samples in memory of the baseband controller.

The baseband controller 220 may generate the boost control signal when it determines that the transmit signal has a peak that exceeds a predetermined enable threshold. The enable threshold may be expressed in terms of a value of the modulus of the transmit signal, as one example, or as the expected amplitude of the output of the PA 234 (e.g., in dBm) as another example. The baseband controller 220 may generate the boost control signal in anticipation of the need for supplemental power by the PA 234, in time for the arrival of the peak (or other signal characteristic calling for additional power) at the PA 234.

In other implementations, a separate detector 311 analyzes signal samples in the memory 309 or from the baseband controller 220 and determines when the signal characteristics (e.g., large peaks) warrant assertion of the boost enable control signal on the boost control pin 313, which generates a separate boost control signal at the boost pin 313. The signal sample memory 309 may be integrated, or in communication, with the detector 311. The signal sample memory 309 may be configured to store signal sample data that the detector analyzes to detect the upcoming peak.

The boost converter 352, an equipment battery (e.g., the battery in a smart phone) or any other supplemental power source may provide the ET power supply 350 with its power source. When the boost converter 352 is the power source, the ET converter 360 may generate output supply voltages for the PA 234 that exceed the nominal Vbatt input, for example. As noted above, the system may supply a boost enable signal to the ET power supply 350 at selected times to enable the boost converter 352. As one example, the system enables the boost converter 352 during peaks in the RF input voltage signal to be amplified. The system battery or another power source, e.g., a second battery, may also power the boost converter 352.

In one example, the switch 356 represents individual switches, each connected between a particular power supply input, e.g., S1 and S2, and the voltage output, Vo. In other implementations, the switch 356 may be an analog multiplexer. When there are two voltage supply options (e.g., the boost converter 352 and Vbatt), then the boost enable signal may also serve as a voltage output selection signal Vselect. When there are more than two voltage supply options, the detector 311 or baseband controller 202 may provide, e.g., a multi-bit selection signal to the ET power supply 350 to select the desired voltage output from the multiple supply options.

Figure 5:
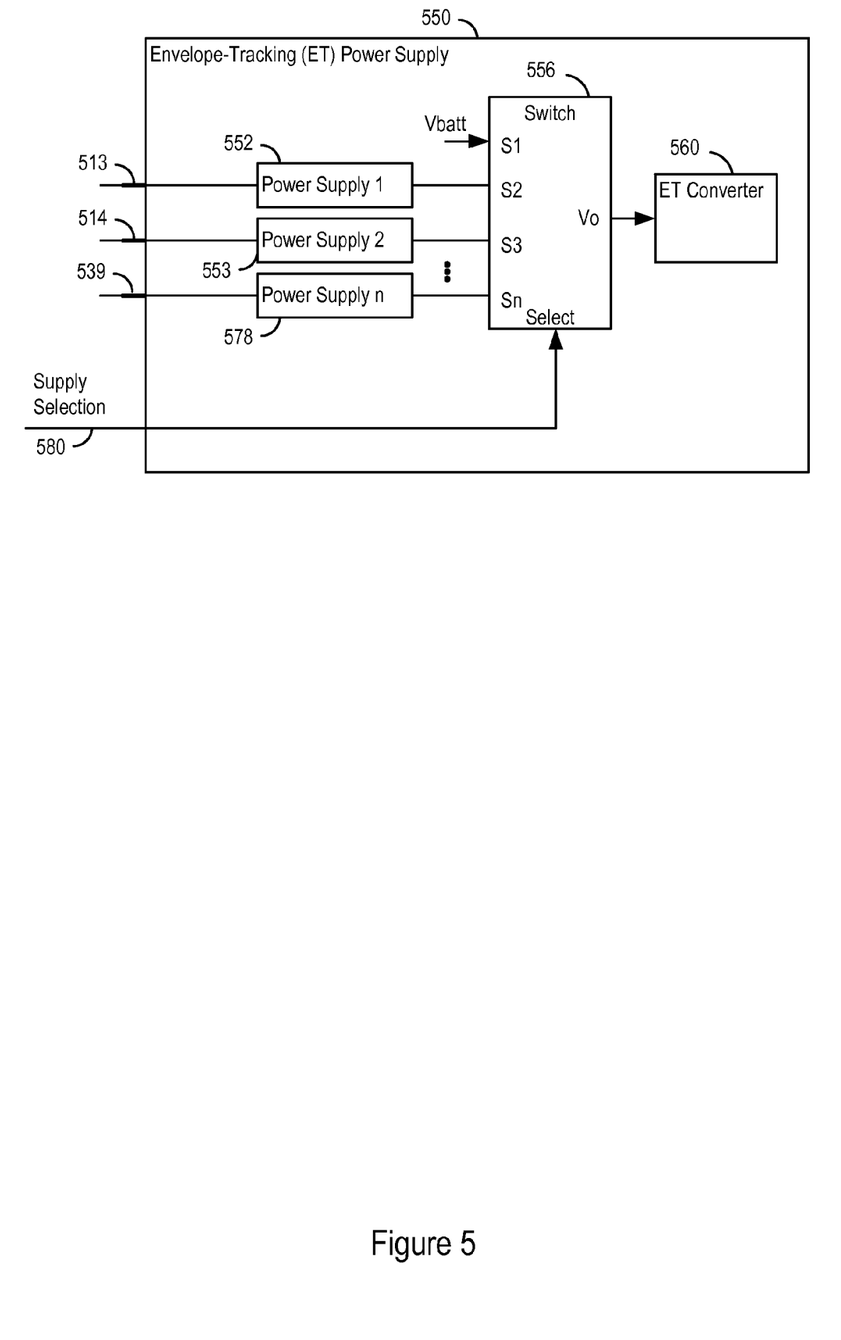
FIG. 5 is an ET power supply as shown FIG. 3, modified to include multiple supplemental power sources that are independently selectable for activation.

FIG. 5 shows an ET power supply 550. The ET power supply 500 shows 'n' supplemental power sources, e.g., the power sources 552, 553 and 578 that are independently selectable for activation. Any of the power sources may be boost converters, and each may have different characteristics, e.g., efficiency, maximum output power, startup delay, output noise, maximum output voltage, or other characteristics. Each supplemental power source 552, 553 and 578 may include a corresponding boost enable pin 513, 514 and 539, respectively. The ET power supply 550 may also include a switch 556 and an ET converter 560. As with switch 356, the switch 556 of FIG. 5 may include multiple individual switches, and analog multiplexer, or other selection circuitry switched or controlled by the supply selection signal 580. The supply selection signal 580 may be supplied by the baseband controller 202 or the detector 311 in concert with the boost enable signals on the boost enable pins. In other implementations, the supply selection signal may be determined by the ET power supply 550 as a function of which boost enable signal is active.

Each of the multiple supplemental power sources may be characterized by power output capacities that may differ from each other. The baseband controller 202 or detector 311 may then detect not only a peak in input signal but also a relative magnitude of the peak, determine one or more appropriate supplemental power sources, and provide a boost enable signal on the specific boost pin(s) for the selected supplemental power source(s). In some implementations multiple power supplies may be enabled and switched through at the same time. For example, power supplies 552 and 553 may provide the same output voltage, but may be able to source different amounts of supply current. Accordingly, either or both power supplies 552 and 553 may be connected to the Vo output depending on the amount of supply current needed by the ET converter 560.

Regarding the supply selection, the baseband controller 202 or detector 311 may include in, e.g., a boost control signal, selection information as to which of the multiple boost converters will provide a boost in power to facilitate the processing stage (e.g., the PA 234) handling the upcoming signal characteristic (e.g., an upcoming signal peak). This selection information may be implemented, for example, with pulse width modulation (PWM) control. In that case, the PWM signal may have, e.g., a variable width that specifically indicates which supplemental power source(s) to enable, or that that indicates how much additional supplemental power may be needed, with control logic in the ET power supply 550 decoding the PWM signal and activating appropriate supplemental power sources. In other implementations, the supply selection signal may be a multi-bit signal that directly controls switches in the switch 556, or a control word sent to the power supply 550.

In some implementations, the variable signal buffer 317 may be included to provide additional timing flexibility. For example, the additional signal buffer 317 may provide additional time for the baseband controller 202 or the detector 311 to effectively look ahead, to determine whether the transmit signal has the particular signal characteristic calling for supplemental power. The look ahead and boost enable(s) may then complete prior to the RF transmit signal peaks arriving at the PA.

Figure 4:
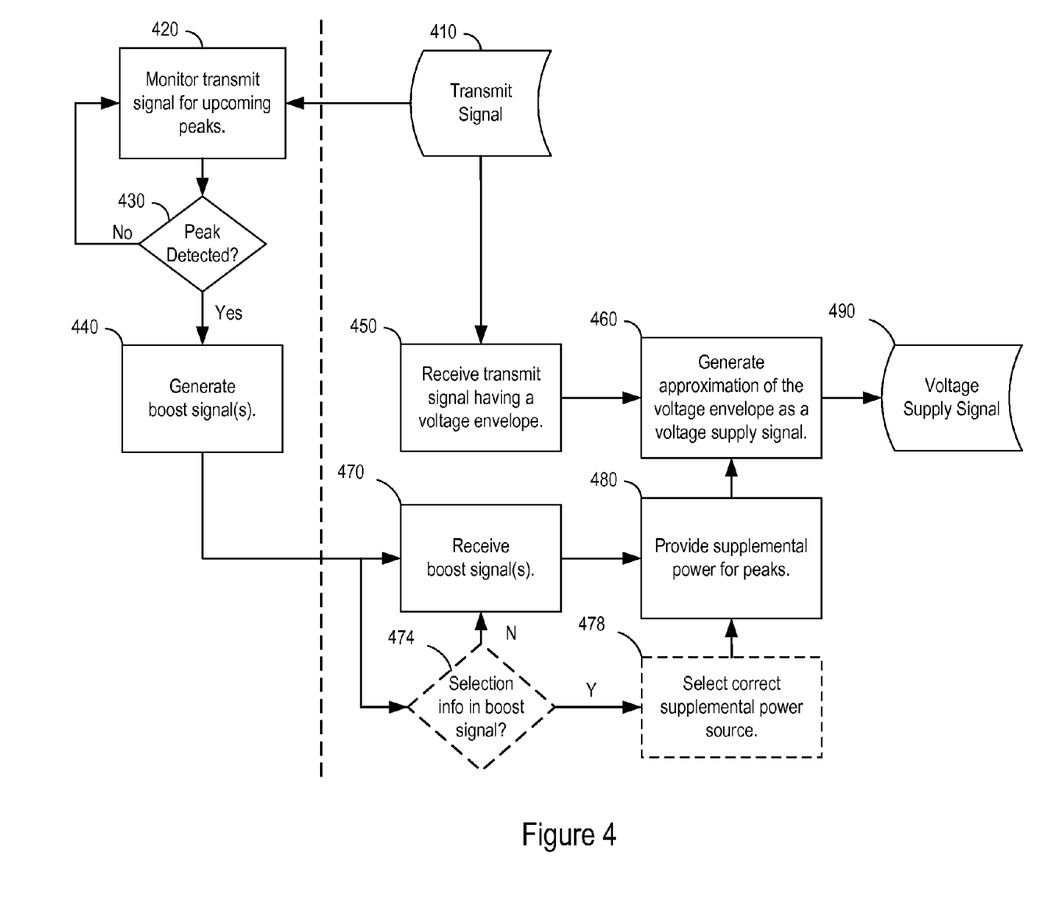
FIG. 4 is a flow chart of an example method for controlling a power boost to an envelope-tracking power supply.

FIG. 4 is a flow diagram of logic 400 for providing supplemental power for an envelope-tracking power supply. The dashed line delineates between actions of the baseband controller or detector on the left and actions by the ET power supply 350 or 550 on the right. A baseband controller may send input signal I/Q samples (or a transmit signal) to the envelope-tracking power supply (410). A voltage detector may monitor the transmit signal for a signal characteristic that warrants providing supplemental power, including upcoming peaks (420). Upon detecting the signal characteristic (430), the detector may generate a boost signal (440). The detection may include determining the extent of the signal characteristic (e.g., the size of the signal peak). The boost signal may specify which supplemental power source to activate, when multiple supplemental power sources are available.

An envelope-tracking (ET) power supply receives a reference voltage derived from the transmit signal, characterized by a voltage envelope (450), and generates an approximation of the voltage envelope of the input voltage signal as a PA voltage supply signal (460). A boost converter may receive the output boost signal (470) and provide supplemental power for selected characteristics of the input signal (480). In some implementations, the ET power supply may detect selection information in the boost signal (474), and select one or more supplemental power sources to supply a variable boost in power for handling the signal characteristic (478). The ET power supply ultimately provides a voltage supply signal (490) that tracks the envelope of the input signal and that is able to deliver the energy needed by the PA to amplify the RF input signal.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A system comprising:
   a voltage output;
   a signal input;
   a boost input; and
   a power converter in communication with the voltage output, the boost input, and the signal input, the power converter operable to:
      receive an input voltage signal on the signal input, the input voltage signal having a voltage envelope;
      generate a voltage supply signal on the voltage output that approximates the voltage envelope; and
      respond to a boost signal present on the boost input by activating a supplemental power source to facilitate generation of the voltage supply signal; and
   a detector configured to:
      determine an upcoming peak in the input voltage signal; and
      output the boost signal on the boost input in response to the upcoming peak.

2. The system of claim 1, where the power converter is operable to disable the supplemental power source except when the boost signal is present.

3. The system of claim 1, where the voltage output comprises a power amplifier voltage supply output.

4. The system of claim 1, where the boost input comprises a dedicated input pin.

5. The system of claim 1, where the power converter is further operable to receive the boost signal prior to receiving a signal peak in the input voltage signal.

6. The system of claim 1, where the supplemental power source comprises a boost converter.

7. The system of claim 1, where the supplemental power source comprises a first supplemental power converter and a second supplemental power converter; and where the power converter is operable to respond to the boost signal by selecting between the first and second supplemental power converters to facilitate generation of the supply voltage.

8. The system of claim 1, where the supplemental power source is configured to boost a signal tracking capability for the voltage supply signal.

9. A method comprising:
   generating, with a power supply, an output power supply voltage that tracks an input signal envelope; and
   obtaining a sample of the input signal envelope;
   storing the sample in a signal sample memory;
   performing, at controller circuitry, an analysis of the sample to determine an upcoming peak in the input signal envelope; and
   responsive to the upcoming peak, boosting a signal tracking capability of the power supply.

10. The method of claim 9, where boosting comprises selectively activating a supplemental power source that boosts the signal tracking capability.

11. The method of claim 9, where boosting the signal tracking capability comprises boosting peak tracking capability of the power supply.

12. The method of claim 9, further comprising:
    receiving a boost configuration input; and
    determining whether to boost the signal tracking capability depending on the boost configuration input.

13. The method of claim 12, where receiving the boost configuration input comprises receiving a boost signal from a baseband controller.

14. The method of claim 9, where boosting the signal tracking capability of the power supply comprises selecting between a first supplemental power converter and a second supplemental power converter to facilitate generation of the supply voltage.

15. A system comprising:
    a power amplifier powered by a voltage supply signal and configured to amplify an input signal for transmission over an antenna;
    an envelope-tracking (ET) converter configured to:
       receive an input voltage signal having a voltage envelope; and
       generate an approximation of the voltage envelope as the voltage supply signal;
    a digital detector configured to:
       detect an upcoming peak in the input voltage signal; and
       output a boost signal in response to the upcoming peak;
    a boost converter configured to:
       receive the boost signal; and
       in response to the boost signal, provide supplemental power to facilitate generating the approximation of the voltage envelope.

16. The system of claim 15, where the boost converter comprises a dedicated boost control pin configured to receive the boost signal from the detector.

17. The system of claim 16, where the boost converter is configured to remain inactive except when the boost signal is present.

18. The system of claim 15, where the boost converter comprises first and second independently selectable power supplies with different power output capacities.

19. The system of claim 15, further comprising:
    a signal sample memory in communication with the detector, the signal sample memory operable to store signal sample data that the detector analyzes to detect the upcoming peak.

20. The system of claim 19, where the detector comprises:
    a baseband controller operable to provide the input voltage signal to the ET converter based on the signal sample data.

* * * * *